US006285613B1

(12) United States Patent
Koya

(10) Patent No.: US 6,285,613 B1
(45) Date of Patent: Sep. 4, 2001

(54) SEMICONDUCTOR MEMORY DEVICE

(75) Inventor: Yoshihito Koya, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/604,725

(22) Filed: Jun. 28, 2000

(30) Foreign Application Priority Data

Jun. 29, 1999 (JP) ................................................. 11-183914

(51) Int. Cl.[7] ....................................................... G11C 7/00
(52) U.S. Cl. ............................................ 365/205; 365/149
(58) Field of Search ................................... 365/205, 207, 365/208, 149; 327/55

(56) References Cited

U.S. PATENT DOCUMENTS

| 5,491,435 | * | 2/1996 | Mun et al. | 327/55 |
| 6,016,729 | * | 1/2000 | Chi | 365/203 |

FOREIGN PATENT DOCUMENTS

| 62-52790 | 3/1987 | (JP) . |
| 1-102794 | 4/1989 | (JP) . |
| 7-107798 | 11/1995 | (JP) . |

\* cited by examiner

*Primary Examiner*—Vu A. Le
(74) *Attorney, Agent, or Firm*—Finnegan, Henderson, Farabow, Garrett & Dunner, L.L.P.

(57) ABSTRACT

A sense amplifier is provided which is easy to sense small signal voltage levels from microstructured memory cells and is suitable for use with high-speed, high-packing-density DRAMs. The sense amplifier has a CMOS flip-flop circuit which is connected to a complementary pair of bit lines and composed of a pair of PMOS transistors and a pair of NMOS transistors. The pairs of PMOS and NMOS transistors each have their common sources connected to a trench or stacked capacitor of three-dimensional structure as auxiliary capacitance for cell capacitance. When a memory cell is selected through a word line, a sense operation is performed which discharges charges on the source capacitors to the paired bit lines. In the sense amplifier, a positive feedback circuit is formed by a PMOS transistor and an NMOS transistor that are conducting in the CMOS flip-flop circuit, which allows a smooth transition from a sense operation to a restore operation.

10 Claims, 12 Drawing Sheets

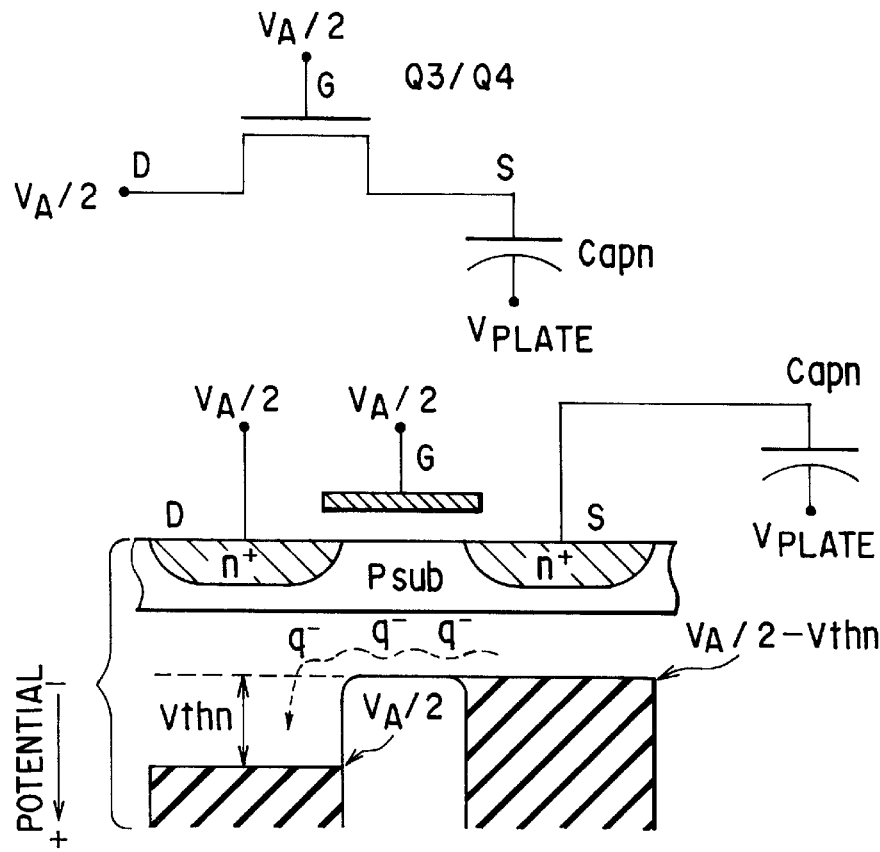
FIG 4A
FIG. 4B
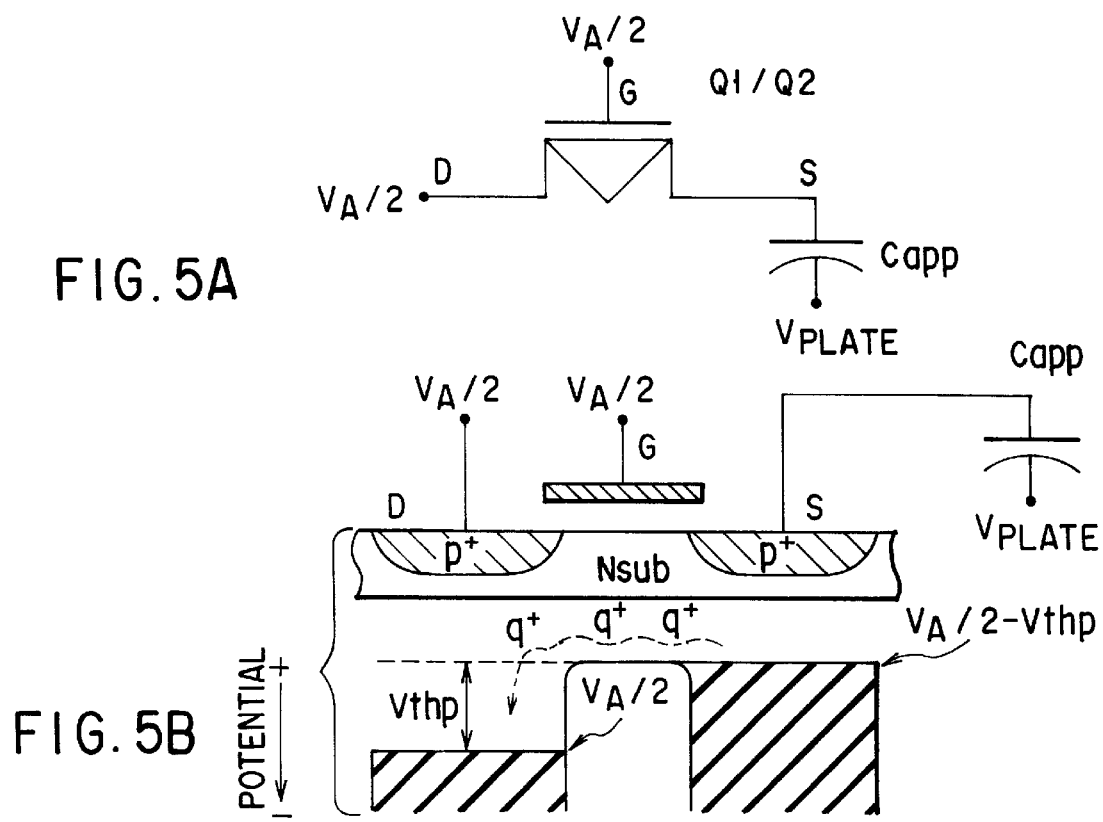
FIG. 5A
FIG. 5B

SEMICONDUCTOR MEMORY DEVICE

CROSS-REFERENCE TO RELATED APPLICATIONS

This application is based upon and claims the benefit of priority from the prior Japanese Patent Application No. 11-183914, filed Jun. 29, 1999, the entire contents of which are incorporated herein by reference.

BACKGROUND OF THE INVENTION

The present invention relates to a semiconductor device and more specifically to a high-density, high-speed dynamic semiconductor memory device.

Conventional semiconductor memory devices include dynamic semiconductor memory devices (hereinafter referred to as DRAMs: Dynamic Random Access Memories) in which each memory cell is composed of one cell capacitor and one cell transistor. The DRAMs are adapted for high packing density because each memory cell takes up a small amount of area. In recent years, therefore, the development of products has been pushed forward in various places to increase the packing density and operating speed of the DRAMS.

In order to increase the packing density, it is required to reduce the thickness of the gate oxide film of each cell transistor and thereby scale down the dimensions of it. However, the thinner the gate oxide film, the lower the supply voltage to the memory cell array has to be set, since the withstand voltage is lowered. On the other hand, the lower the supply voltage to the memory cell array, the lower the signal level for sensing data stored in each memory cell becomes. As the supply voltage to the memory cell array is lowered, the threshold voltage $V_{thn}$ of the N-channel MOS transistors of each flip-flop (F/F) that discriminates a signal voltage in the initial stage of a sense operation has to be lowered. However, it is not easy to lower the threshold voltage $V_{thn}$ according to scaling rules.

The sense margin of sense amplifiers depends on the threshold voltage $V_{thn}$. Thus, when the magnitude of the threshold voltage $V_{thn}$ is large and the signal level to be detected is low, the normal sense operation becomes difficult to perform. Difficulties are therefore involved in adopting conventional sense amplifiers.

The S/N ratio of the conventional sense amplifiers depends on the transition characteristic (driving speed K) of the common source voltage of N-channel MOS transistors in each F/F because of unbalance of electric parameters of a pair of bit lines and a sense amplifier. With the conventional sense amplifiers, therefore, the lower the driving speed K with which the precharged voltage discharges down to ground voltage, the higher the sensitivity becomes. Thus, the conventional sense amplifiers have a problem that, as semiconductor memory devices advance in fine device structure and speed, it becomes more and more difficult to sense the signal level of each memory cell.

BRIEF SUMMARY OF THE INVENTION

It is therefore an object of the present invention to provide a sense amplifier circuit which is easy to sense signal levels of memory cells and suitable for use with high-density high-speed DRAMS.

In a semiconductor memory device of the present invention, a sense amplifier connected to a pair of complementary bit lines has a CMOS flip-flop composed of N-channel MOS transistors (NMOS transistors) and P-channel MOS transistors (PMOS transistors) and first and second source capacitors are connected to the common sources of the NMOS transistors and the PMOS transistors, respectively, as auxiliary capacitors for a cell capacitor. Each of the source capacitors is a trench or stacked capacitor of three-dimensional structure.

Specifically, a semiconductor memory device of the invention comprises: a memory cell array; a sense amplifier connected to a pair of complementary bit lines, the sense amplifier having a CMOS flip-flop circuit composed of a pair of PMOS transistors having their sources connected together and a pair of NMOS transistors having their sources connected together; a first source capacitor connected to the common sources of the pair of PMOS transistors; and a second source capacitor connected to the common sources of the pair of NMOS transistors.

Preferably, each of the first and second source capacitors consists of a trench capacitor or stacked capacitor formed between the corresponding transistors.

Preferably, the sense amplifier is connected between first and second supply voltages, the first source capacitor stores an amount of charge corresponding to the sum of the average value of the first and second supply voltages and the absolute value of the threshold voltage of the PMOS transistors, the second source capacitor stores an amount of charge corresponding to the sum of the average value of the first and second supply voltages and the absolute value of the threshold voltage of the NMOS transistors, and in a state where the sense amplifier is coupled with a cell capacitor in the memory cell array a sense operation is performed which divides charges stored on the first and second source capacitors between the capacitance associated with the bit lines and the capacitance of the cell capacitor.

Preferably, the sense amplifier is connected between first and second supply voltages, the CMOS flip-flop circuit comprises a first CMOS inverter consisting of one of the PMOS transistors and one of the NMOS transistors and a second CMOS inverter consisting of the other of the PMOS transistors and the other of the NMOS transistors, and a restore operation for a cell capacitor is performed by connecting the first supply voltage to one of the bit lines through a switching transistor connected to the first supply voltage and the PMOS transistor in the first CMOS inverter and connecting the second supply voltage to the other of the bit lines through a switching transistor connected to the second supply voltage and the NMOS transistor in the second CMOS inverter.

Preferably, a precharge operation for the bit lines is performed by discharging charges stored on the first and second source capacitors through the NMOS and PMOS transistors in the first CMOS inverter, one of the bit lines which is connected to the common drains of the NMOS and PMOS transistors in the first CMOS inverter and a switching transistor connected to the one of the bit lines to a terminal placed at the average voltage of the first and second supply voltages and discharging the charges stored on the first and second source capacitors through the NMOS and PMOS transistors in the second CMOS inverter, the other of the bit lines which is connected to the common drains of the NMOS and PMOS transistors in the second CMOS inverter and a switching transistor connected to the other of the bit lines to a terminal placed at the average voltage of the first and second supply voltages.

Another semiconductor memory device of the present invention comprises: a memory cell array having memory cells arranged in rows and columns, each of the memory cells being composed of one cell transistor and one cell capacitor; word lines each extending in the row direction of the memory cell array and pairs of complementary bit lines each extending in the column direction of the memory cell array; and sense amplifiers each connected with a corresponding one of the pairs of complementary bit lines, in each of the memory cells the cell capacitor having its plate connected to the source of the cell transistor and the cell transistor having its gate connected with a corresponding one of the word lines and its drain connected to one bit line of a corresponding one of the pairs of complementary bit lines, each of the sense amplifiers comprising a CMOS flip-flop circuit composed of first and second PMOS transistors and first and second NMOS transistors, in the CMOS flip-flop circuit the first and second PMOS transistors having their sources connected to a first supply voltage through a first switching transistor and the first and second NMOS transistors having their sources connected to a second supply voltage through a second switching transistor, the first PMOS transistor and the first NMOS transistor having their drains connected together to the one bit line and their gates connected together to the other bit line of the corresponding one of the pairs of complementary bit lines, the second PMOS transistor and the second NMOS transistor having their drains connected together to the other bit line and their gates connected together to the one bit line, the first and second PMOS transistors having their sources connected together to a first source capacitor, and the first and second NMOS transistors having their sources connected together to a second source capacitor.

Preferably, in a sense operation of the sense amplifier a positive feedback circuit is formed so that the cell transistor is rendered conductive by the word line being selected, charge stored on the cell capacitor is discharged to the one bit line through the cell transistor, the potential on the channel of the second NMOS transistor goes high through its gate connected to the one bit line by the voltage on the one bit line that has changed as a result of the discharging of the cell capacitor going higher than the precharged voltage of the bit lines, charge stored on the second source capacitor connected to the source of the second NMOS transistor is discharged through its channel to the other bit line, and the first PMOS transistor is rendered conductive by the potential on the other bit line going lower as a result of the discharging of the second source capacitor, thereby allowing charge stored on the first source capacitor to be discharged to the one bit line and further increasing the voltage on the one bit line.

Preferably, the sense operation of the sense amplifier is performed by applying a voltage lower than the average of the first and second supply voltages to the gate of the first switching transistor and applying a voltage higher than the average of the first and second supply voltages to the gate of the second switching transistor.

Preferably, a restore operation for charge stored on the cell capacitor is performed by applying the first supply voltage to the one bit line through the first switching transistor and the first PMOS transistor which has been rendered conductive in the sense operation and applying the second supply voltage to the other bit line through the second switching transistor and the second NMOS transistor which has been rendered conductive in the sense operation.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

FIG. 4A shows the equivalent circuit illustrating the interconnection between an NMOS transistor in the CMOS flip-flop in the sense amplifier and a source capacitor according to the first embodiment;

FIG. 4B is a sectional view of the NMOS transistor of FIG. 4A and illustrates the initial charge and potential distributions in the NMOS transistor;

FIG. 5A shows an equivalent circuit illustrating the interconnection between a PMOS transistor in the CMOS flip-flop in the sense amplifier and a source capacitor in the first embodiment;

FIG. 5B is a sectional view of the PMOS transistor of FIG. 5A and illustrates the initial charge and potential distributions in the PMOS transistor;

DETAILED DESCRIPTION OF THE INVENTION

Figure 1:
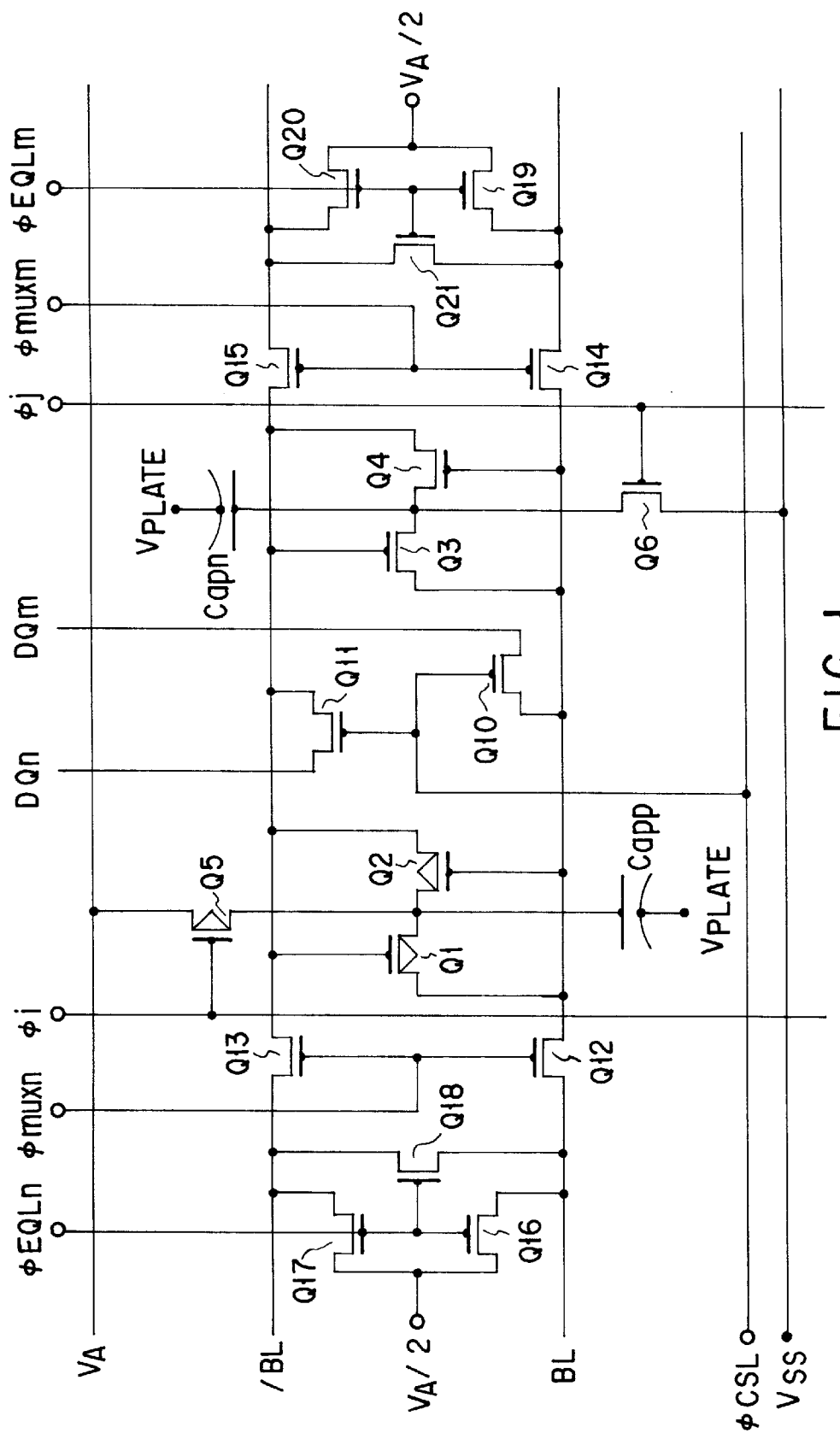
FIG. 1 shows the arrangement of a sense amplifier according to a first embodiment of the present invention.

The preferred embodiments of the present invention will be described in detail below with reference to the accompanying drawings. In FIG. 1 there is illustrated the arrangement of a sense amplifier connected to a pair of bit lines BL and /BL in a semiconductor memory device according to a first embodiment of the present invention. Transistors Q1 and Q2 are PMOS transistors and transistors Q3 and Q4 are NMOS transistors, which constitute a CMOS flip-flop in the sense amplifier.

Capp denotes a PMOS-side source capacitor in the first embodiment, which has its plate connected to the common sources of the PMOS transistors Q1 and Q2. When rendered conductive by a control signal $\phi_i$, a PMOS transistor Q5 connects the common sources to a supply voltage $V_A$. The other plate of the capacitor Capp is connected with a bias voltage $V_{PLATE}$.

Capn denotes an NMOS-side source capacitor according to the first embodiment, which has its plate connected to the common sources of the NMOS transistors Q3 and Q4. When rendered conductive by a control signal $\phi_j$, an NMOS transistor Q6 connects the common sources to a supply voltage $V_{SS}$. The other plate of the capacitor Capn is connected with the bias voltage $V_{PLATE}$.

NMOS transistors Q10 and Q11 form an input/output section of the sense amplifier which is responsive to a chip select signal $\phi_{CSL}$ to transfer data between paired bit lines BL and /BL and data lines $DQ_n$ and $DQ_m$.

That is, data read out of a memory cell onto the paired bit lines BL and /BL is latched by the CMOS F/F composed of the transistors Q1, Q2, Q3, and Q4, so that the voltage levels on the bit lines are fixed. The voltage levels are transferred through the input/output transistors Q10 and Q11 onto the data lines $DQ_n$ and $DQ_m$.

Write data transferred from the data lines $DQ_n$ and $DQ_m$ onto the paired bit lines BL and /BL are latched by the CMOS F/F composed of the transistors Q1 to Q4 and then written into a memory cell. NMOS transistors Q12 and Q13 serve to connect or disconnect the paired bit lines BL and /BL to or from the sense amplifier in response to a control signal $\phi_{muxn}$. Likewise, NMOS transistors Q14 and Q15 are responsive to a control signal $\phi_{muxm}$ to connect or disconnect the paired bit lines BL and /BL to or from the sense amplifier.

On the left-hand side of the sense amplifier shown in FIG. 1 is provided an equalizer circuit composed of NMOS transistors Q16, Q17, and Q18. On the right-hand side of the sense amplifier is provided an equalizer circuit composed of NMOS transistors Q19, Q20, and Q21. Each of the equalizer circuits is responsive to a corresponding one of equalize signals $\phi_{EQLn}$ and $\phi_{EQLm}$ to set the potential on each of the bit lines BL and /BL to $V_A/2$.

Figure 2A:
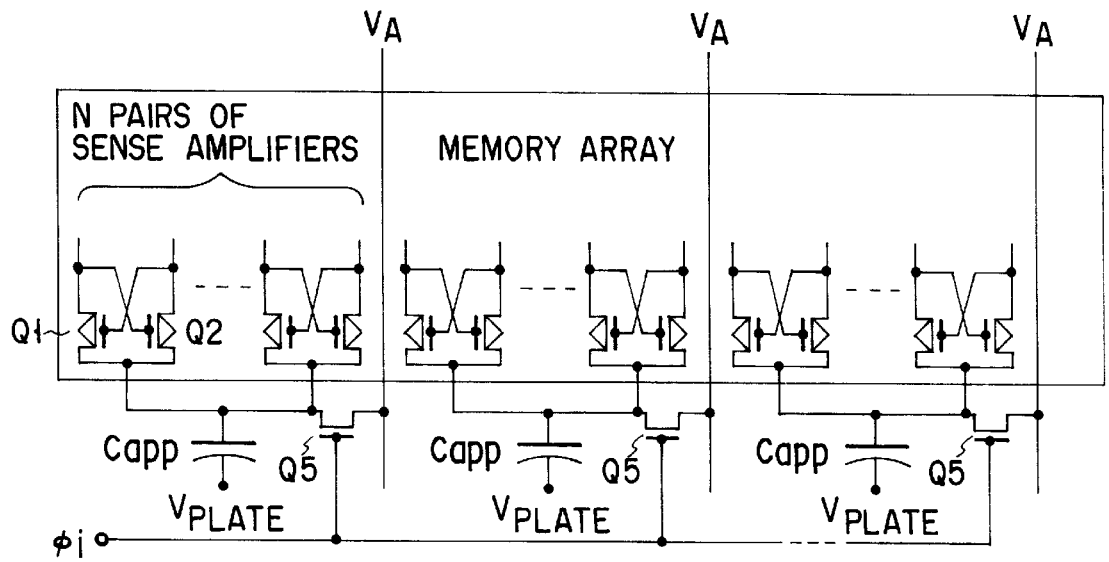
FIGS. 2A and 2B how the arrangement of the sense amplifiers on a memory cell array in the first embodiment.
Figure 2B:
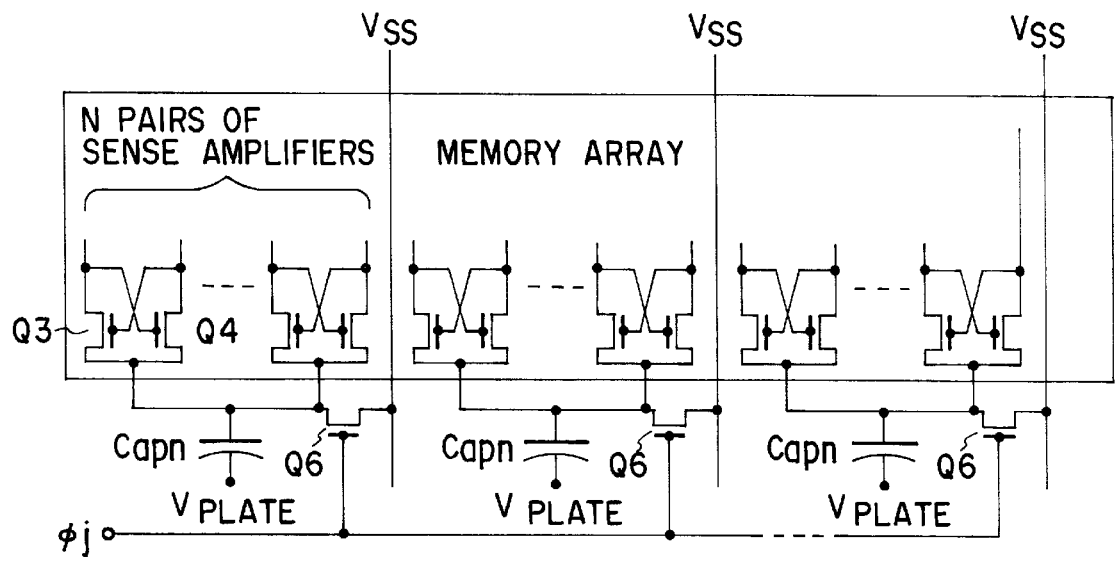

FIGS. 2A and 2B show the arrangement of sense amplifiers on a memory cell array which have source capacitors in accordance with the first embodiment. As shown in FIG. 2A, the memory cell array is divided into subarrays each having N pairs of sense amplifiers. In each subarray, the common sources of each pair of PMOS transistors Q1 and Q2 in the N pairs of sense amplifiers are connected to one plate of a common source capacitor Capp. For each subarray, the common sources of each pair of MOS transistors Q1 and Q2 are connected to a supply voltage $V_A$ through an NMOS transistor Q5 having its gate connected to receive a control signal $\phi_i$. The other plate of each source capacitor Capp is connected to a bias voltage $V_{PLATE}$.

In FIG. 2B, likewise, the common sources of each pair of NMOS transistors Q3 and Q4 in the N pairs of sense amplifiers in each subarray are connected to one plate of a common source capacitor Capn. For each subarray, the common sources of each pair of NMOS transistors Q3 and Q4 are connected to a supply voltage $V_{SS}$ through an NMOS transistor Q6 having its gate connected to receive a control signal $\phi_j$. The other plate of each source capacitor Capn is connected to the bias voltage $V_{PLATE}$.

Figure 3A:
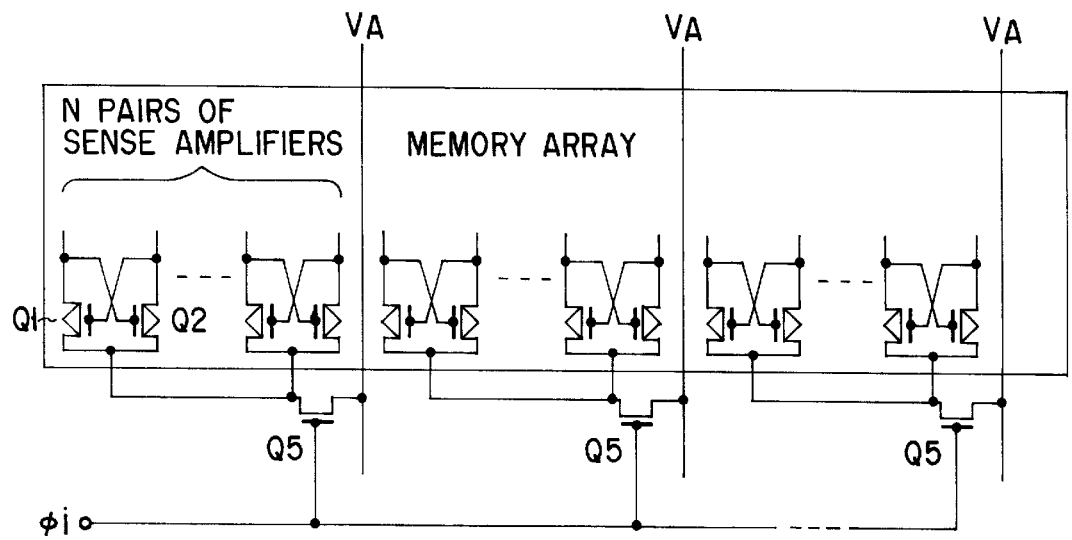
FIGS. 3A and 3B how the arrangement of conventional sense amplifiers on a memory cell array.
Figure 3B:
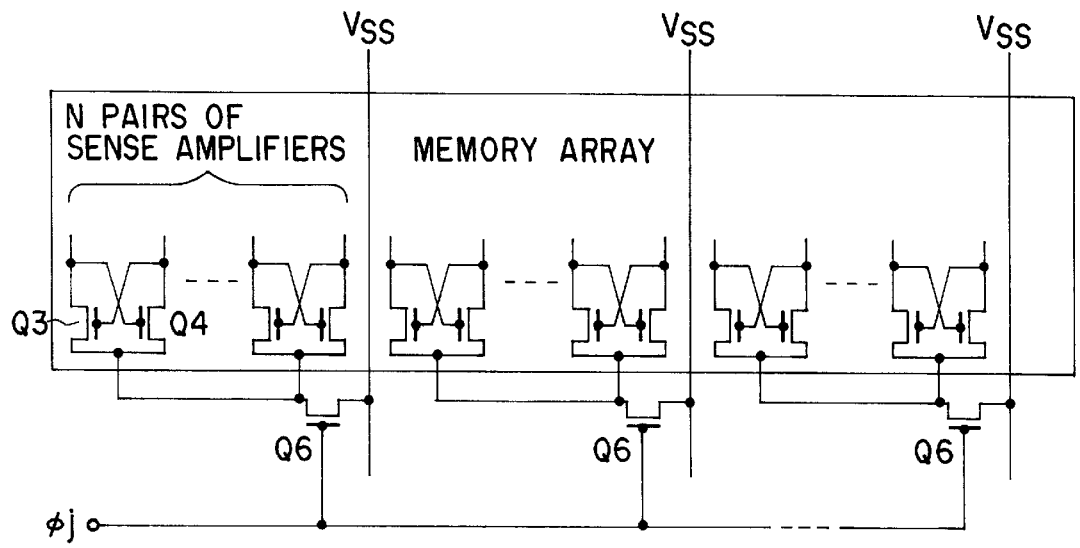

For comparison with the first embodiment, the arrangement of sense amplifiers on a conventional memory cell array is illustrated in FIGS. 3A and 3B. The arrangement on the PMOS transistor side is illustrated in FIG. 3A, while the NMOS transistor side arrangement is illustrated in FIG. 3B. In either arrangement, no source capacitor is present.

FIG. 4B shows charge and potential distributions in the initial state of one of the paired NMOS transistors Q3 and Q4 forming a CMOS F/F in a sense amplifier according to the first embodiment. In FIG. 4B, the positive direction for the potential is set to be the downward direction for the purpose of making the movement of electron charge q⁻ easy to understand.

FIG. 4A shows the equivalent circuit. The source S of the NMOS transistor is connected with one plate of the source capacitor Capn the other plate of which is connected with the bias voltage $V_{PLATE}$.

As described previously in connection with FIG. 1, in the initial state the paired bit lines BL and /BL are equalized to $V_A/2$ through a precharge operation; thus, the NMOS transistor in FIG. 4A has its gate G and drain D supplied with the voltage $V_A/2$.

The sectional structure of the NMOS transistor is shown in the upper part of FIG. 4B. The source region S and the drain region D, each of n⁺ region, are formed by heavily doping a P-type silicon substrate $P_{sub}$ with N-type impurities of, say, As. The surface of the P-type silicon substrate $P_{sub}$ which is opposed to the gate G with a gate oxide film (not shown) interposed therebetween is inverted to N type by applying the gate with a positive potential, forming an N channel between the source and drain regions.

Assuming the threshold voltage of the channel to be $V_{thn}$ and with the gate G and the source S at $V_A/2$, the channel potential is set at $V_A/2-V_{thn}$.

If an adequate number of electrons q⁻ is present in the source S, then the source potential will also be set at $V_A/2-V_{thn}$ as with the channel. In this state, thermal energy allows electrons in the source region S to flow into the higher-potential drain region D across the channel. That is, excess electrons supplied from the source region S with which the source capacitor Capn is connected are absorbed into the drain region D across the potential barrier of the channel.

The potential on the source region S depends on residual electrons and hence cannot be below the channel potential. The source region S is set at the same potential as the channel. The source potential is $V_A/2-V_{thn}$ and the drain potential is $V_A/2$ as can be seen from FIG. 4B. If, therefore, electrons stored on the source capacitor Capn are caused to flow into the drain region through the NMOS transistor having its gate and drain set at $V_A/2$, then a potential difference of $V_{thn}$ will be produced between the source and drain regions.

FIG. 5B shows charge and potential distributions in the initial state of one of the paired PMOS transistors Q1 and Q2 forming an F/F in a sense amplifier according to the first embodiment. FIG. 5A shows the equivalent circuit. The source S of the PMOS transistor is connected with one plate of the source capacitor Capp the other plate of which is connected with the bias voltage $V_{PLATE}$.

In the initial state, the paired bit lines BL and /BL are equalized to $V_A/2$ through a precharge operation; thus, the PMOS transistor in FIG. 5A has its gate G and drain D supplied with the voltage $V_A/2$.

The sectional structure of the PMOS transistor is shown in the upper part of FIG. 5B. The source region S and the drain region D, each of P⁺ region, are formed by subjecting an N-type silicon substrate $N_{sub}$ to selective implantation or diffusion of P-type impurities of, say, B (boron). The surface of the N-type silicon substrate $N_{sub}$ which is opposed to the gate G is inverted to P type by applying the gate with a negative potential, forming a P channel between the source and drain regions.

Assuming the threshold voltage of the PMOS transistor to be $V_{thp}$ and if electrons stored on the source capacitor Capp are caused to flow into the drain region through the PMOS transistor having its gate and drain set at $V_A/2$, then a potential difference of $V_{th}$ will be produced between the source and drain regions as can be seen from the potential distribution of FIG. 5B. Within the PMOS transistor, electrons stored on the capacitor Capp flow as holes having a positive charge q⁺; thus, in FIG. 5B, the negative potential is illustrated so that its absolute value increases downward for the purpose of making the movement of holes easy to understand.

The potential distribution in the NMOS and PMOS transistors described in connection with FIGS. 4B and 5B will be useful in understanding the operation of the sense amplifier of the present invention to be described hereinafter.

Figure 6A:
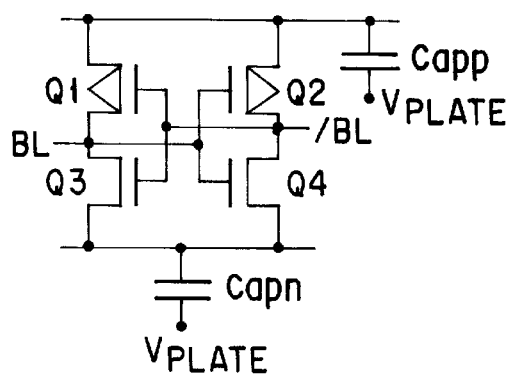
FIG. 6A shows an equivalent circuit illustrating the interconnection relationship between the CMOS flip-flop constituting a sense amplifier and source capacitors according to a second embodiment of the present invention.

The structure of a sense amplifier in a semiconductor memory device according to a second embodiment will be described next with reference to FIGS. 6A, 6B and 6C. The equivalent circuit of a CMOS F/F that constitutes a sense amplifier is shown in FIG. 6A. In this CMOS F/F, a source capacitor Capn is connected to the common sources of NMOS transistors Q3 and Q4 and a source capacitor Capp is connected to the common sources of PMOS transistors Q1 and Q2. The second embodiment is characterized in that each of these source capacitors is formed to have a trench type of three-dimensional structure.

As described previously in connection with FIG. 1, PMOS transistors Q1 and Q2 and NMOS transistors Q3 and Q4 constitute a CMOS flip-flop (F/F) of each sense amplifier. Capp denotes the source capacitor for the PMOS transistors which is connected between the common sources of the transistors Q1 and Q2 and the bias voltage $V_{PLATE}$ terminal. Capn denotes the source capacitor for the NMOS transistors which is connected between the common sources of the transistors Q3 and Q4 and the bias voltage $V_{PLATE}$ terminal.

The PMOS transistor Q1 and the NMOS transistor Q3 have their gates connected together, whereas the PMOS transistor Q2 and the NMOS transistor Q4 have their gates connected together. The bit line BL is connected to the common drains of the CMOS transistors Q1 and Q3 and to the common gates of the CMOS transistors Q2 and Q4. The bit line /BL complementary to the bit line BL is connected to the common drains of the CMOS transistors Q2 and Q4 and to the common gates of the CMOS transistors Q1 and Q3.

As shown in FIG. 6A, the CMOS flip-flop composed of a first CMOS inverter consisting of CMOS transistors Q1 and Q3 and a second CMOS inverter consisting of CMOS transistors Q2 and Q4 latches the potentials on the paired bit lines BL and /BL, thereby allowing reading from or writing into a memory cell connected to the bit lines.

Figure 6B:
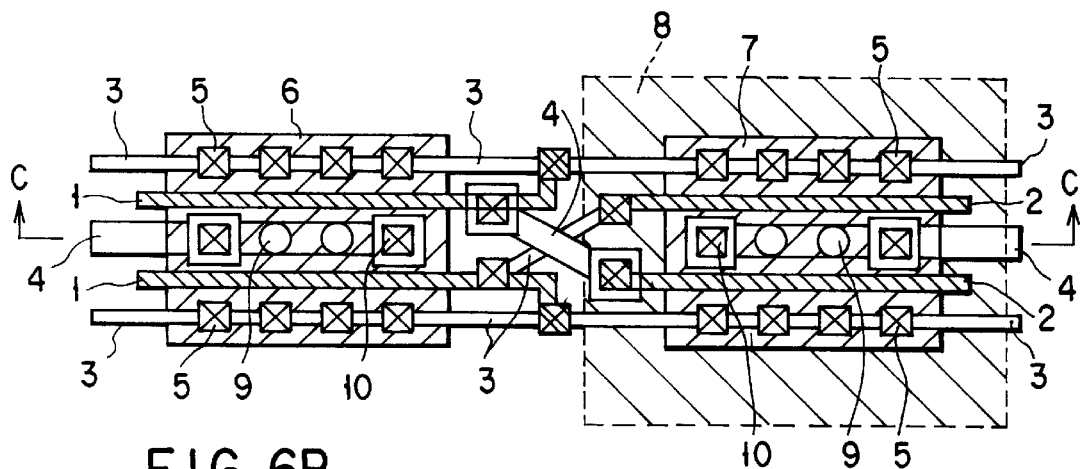
FIG. 6B is a plan view of the CMOS flip-flop constituting the sense amplifier and the source capacitors in the second embodiment.

FIG. 6B shows the pattern layout of the CMOS flip-flop shown in FIG. 6A. The PMOS transistors are arranged on the right-hand side of FIG. 6B, and the NMOS transistors on the left-hand side.

In the pattern layout of the flip-flop shown in FIG. 6B, 1 denotes N-type polysilicon layers each of which forms the gate of a corresponding one of the NMOS transistors Q3 and Q4, 2 denotes P-type polysilicon layers each of which forms the gate of a corresponding one of the PMOS transistors Q1 and Q2, 3 denotes first-level metal interconnections each of which forms a corresponding one of the paired bit lines BL and /BL, and 4 denotes second-level metal interconnections each of which is connected to the common sources of a corresponding one of the pairs of PMOS transistors Q1 and Q2 and NMOS transistors Q3 and Q4.

Each of the bit lines BL and /BL is connected to the drains of the corresponding PMOS and NMOS transistors via contact holes 5.

On a P-type silicon substrate $P_{sub}$ 11 are formed N-type diffusion layers 6 serving as the drain/source regions of the NMOS transistors Q3 and Q4 and an N-well 8 in which the PMOS transistors Q1 and Q2 are to be formed. In the N-well 8 are formed P-type diffusion layers 7 serving as the drain/source regions of the PMOS transistors Q1 and Q2.

Each of the source capacitor Capp for the PMOS transistor pair and the source capacitor Capn for the NMOS transistor pair is formed in a three-dimensional structure using two trenches 9 and connected with the second-level metal interconnection 4 that forms the common source interconnection for a corresponding one of the PMOS transistor pair (Q1 and Q2) and the NMOS transistor pair (Q3 and Q4) via contact holes 10.

Figure 6C:
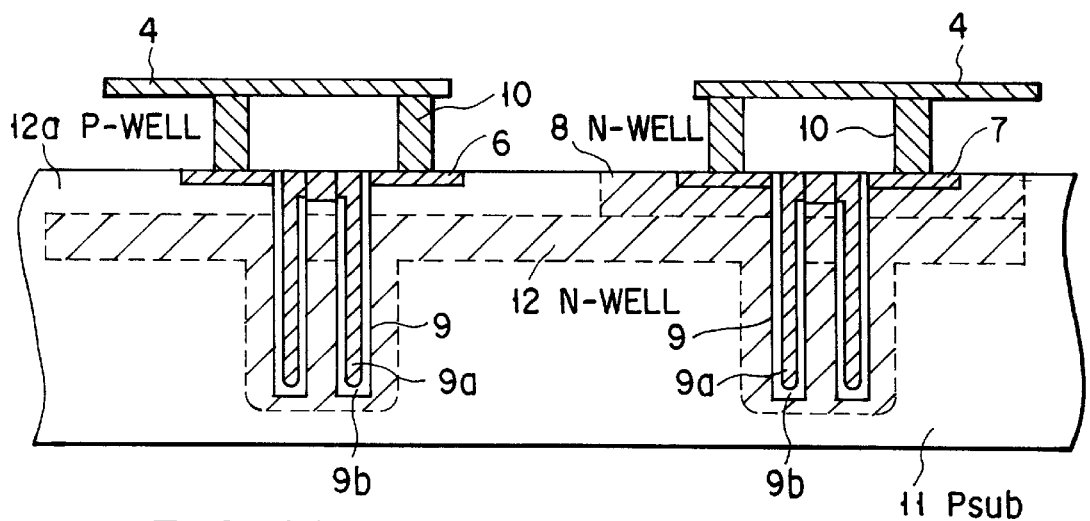
FIG. 6C is a sectional view of source capacitors of a trench type in the second embodiment.

FIG. 6C is a sectional view taken along line C—C of FIG. 6B. In FIG. 6C, the connection structure of the bit lines BL and /BL and the polysilicon gates 1 and 2 in the middle between the PMOS and NMOS portions is omitted.

As shown in FIG. 6C, in the P-type silicon substrate $P_{sub}$ 11 are formed the N-well 12, the N-well 8 for isolating the P-type diffusion layers 7 on the PMOS side from the substrate 11, and the P-well 12a for isolating the N-type diffusion layers 6 formed on the NMOS side from the N-well 12. These wells are formed by selectively implanting or diffusing impurity ions into the substrate.

In the example of FIG. 6C, the source capacitors Capp and Capn of the present invention are each formed from trenches 9, storage nodes 9a formed in the trenches and serving as one plate of the capacitor, the N-well 12 serving as the other plate of the capacitor, and contact holes (contact metal) 10 that make connection between the second-level metal interconnection (common source interconnection) 4 and the P-type or N-type diffusion layers 7 or 6.

Next, the structure of a sense amplifier according to a third embodiment of the present invention will be described with reference to FIGS. 7A and 7B. The CMOS flip-flop forming a sense amplifier shown in FIGS. 7A and 7B is characterized in that the source capacitors Capp and Capn each have a stacked type of three-dimensional structure.

Figure 7A:
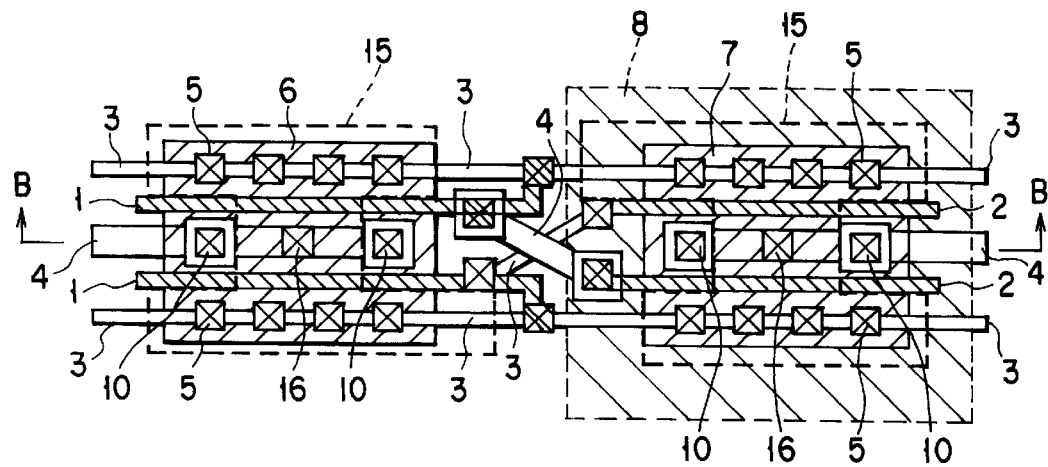
FIG. 7A is a plan view of a CMOS flip-flop constituting a sense amplifier and source capacitors according to a third embodiment.

FIG. 7A shows the pattern layout of the CMOS flip-flop containing the source capacitors Capp and Capn. Areas 15 surrounded with bold dashed lines each indicate the planar shape of the stacked source capacitor. Each of the stacked source capacitors is connected by a capacitor contact 16 to a corresponding one of the P-type and N-type diffusion layers 7 and 6 which form the common source regions of the PMOS transistors and the NMOS transistors, respectively. Each of the common source regions is connected through contact holes 10 with the second-level metal interconnection 4 serving as the common source interconnection.

Figure 7B:
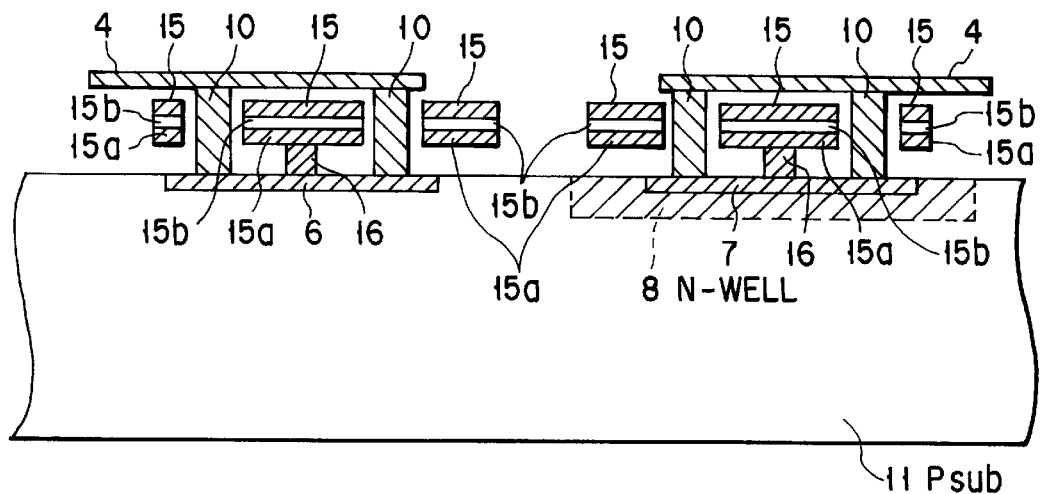
FIG. 7B is a sectional view of stacked source capacitors in the third embodiment.

The section of the stacked source capacitors 15 each having a storage node 15a and a dielectric film 15b is shown in FIG. 7B. Each of the stacked source capacitors is connected by the capacitor contact 16 to a corresponding one of the P-type and N-type diffusion layers 7 and 6 which form the common source regions of the PMOS transistors and the NMOS transistors, respectively. Each of the common source regions is connected through the contact holes (contact metal) 10 with the second-level metal interconnection 4 serving as the common source interconnection. The P-type silicon substrate 11 and the P-type diffusion layer 7 are isolated from each other by N-well 8.

Next, the sense operation of the semiconductor memory device according to a fourth embodiment will be described. The fourth embodiment will be described in terms of a sense operation of reading charge stored on a cell capacitor using the sense amplifier described in connection with the first to third embodiments.

Figure 8A:
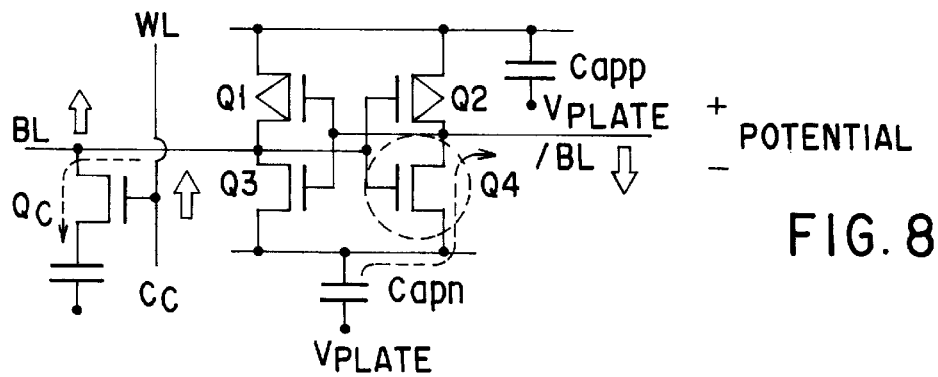
FIG. 8A shows an intermediate state of a sense operation in an equivalent circuit illustrating interconnection between a memory cell and a sense amplifier according to a fourth embodiment.

In the sense amplifier in which the source capacitors Capp and Capn are respectively connected to the common sources of the PMOS transistors Q1 and Q2 and the NMOS transistors Q3 and Q4 that form a CMOS flip-flop as shown in FIG. 8A, when a word line WL is selected, a cell transistor $Q_c$ is activated, so that charge q⁻ on a cell capacitor $C_c$ is discharged to the bit line BL. The dashed arrow indicates the direction of flow of electrons.

Figure 8B:
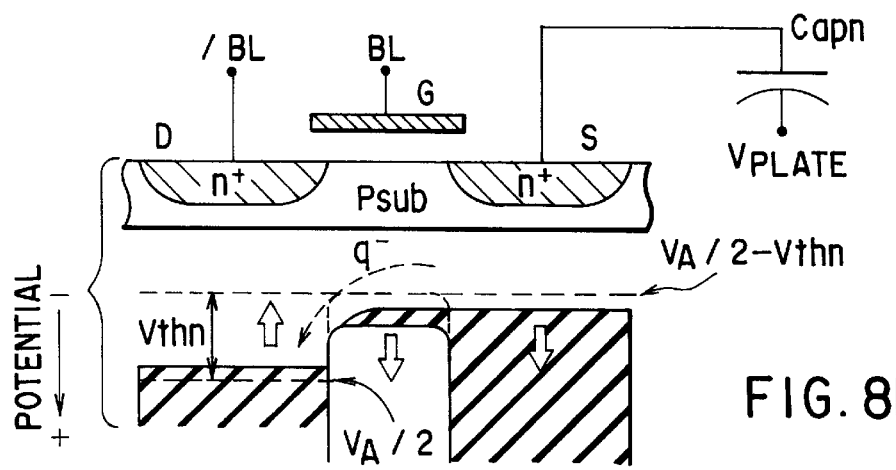
FIG. 8B is a sectional view of an NMOS transistor and illustrates variations in charge and potential distributions in the NMOS transistor in the intermediate state of the sense operation shown in FIG. 8A.

If the potential on the bit line BL which has changed as a result of the discharge is higher than the bit line precharge voltage $V_A/2$ (see the bold arrow shown on the bit line in FIG. 8A), the potential on the gate of the NMOS transistor Q4 (enclosed with dashed line) connected to the bit line BL is raised. The raised potential on the gate of the NMOS transistor Q4 will cause the potential on the channel immediately below the gate to rise as shown in FIG. 8B, allowing stored charge on the source capacitor Capn connected to the source of the NMOS transistor Q4 to discharge to the bit line /BL complementary to the bit line BL as shown by dashed arrows in FIGS. 8A and 8B.

Figure 9A:
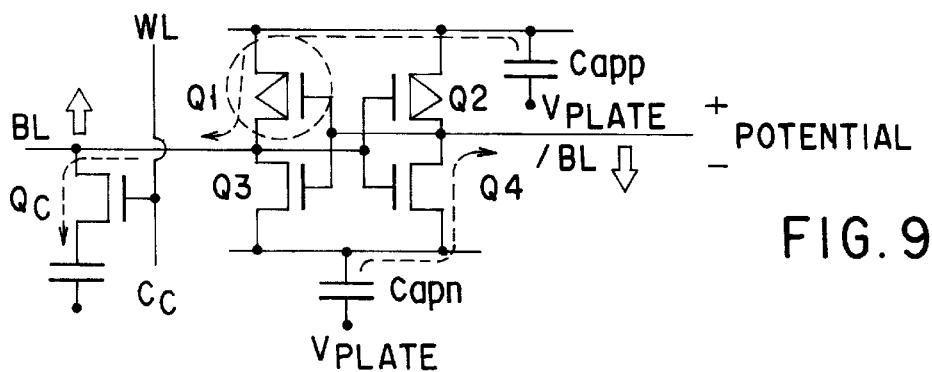
FIG. 9A shows another intermediate state of the sense operation the equivalent circuit of FIG. 8A.
Figure 9B:
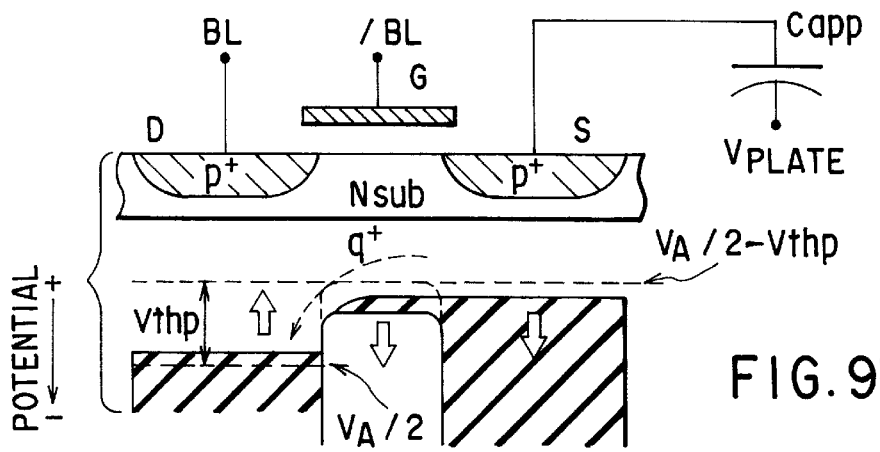
FIG. 9B is a sectional view of a PMOS transistor and illustrates variations in charge and potential distributions in the PMOS transistor in the intermediate state of the sense operation shown in FIG. 9A.

Next, as shown in FIG. 9A, if the voltage on the bit line /BL goes low, then the PMOS transistor Q1 enclosed with dashed line turns ON, allowing charge stored on the source capacitor Capp to discharge to the bit line BL as shown by dashed line in FIGS. 9A and 9B.

Figure 10A:
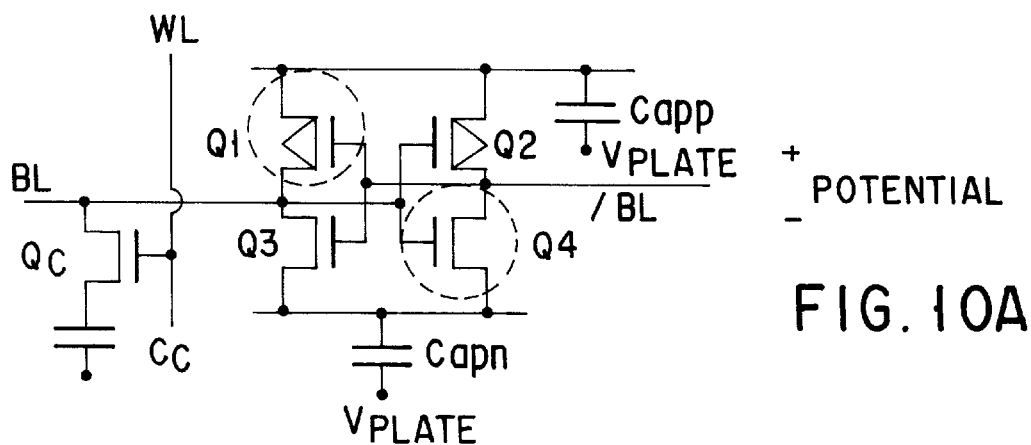
FIG. 10A shows the final state of the sense operation in the equivalent circuit of FIG. 8A in the fourth embodiment.
Figure 10B:
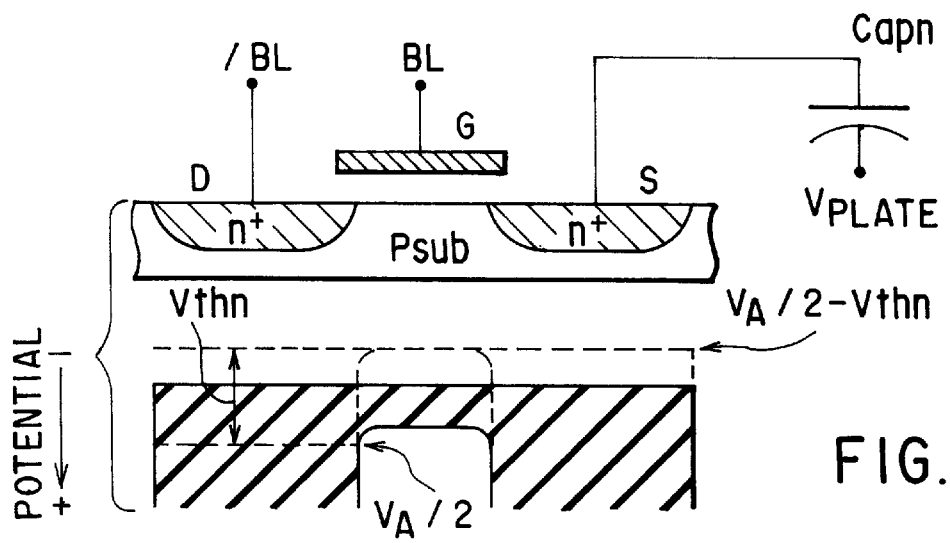
FIG. 10B shows the charge and potential distributions in the NMOS transistor at the termination of the sense operation in the fourth embodiment.
Figure 10C:
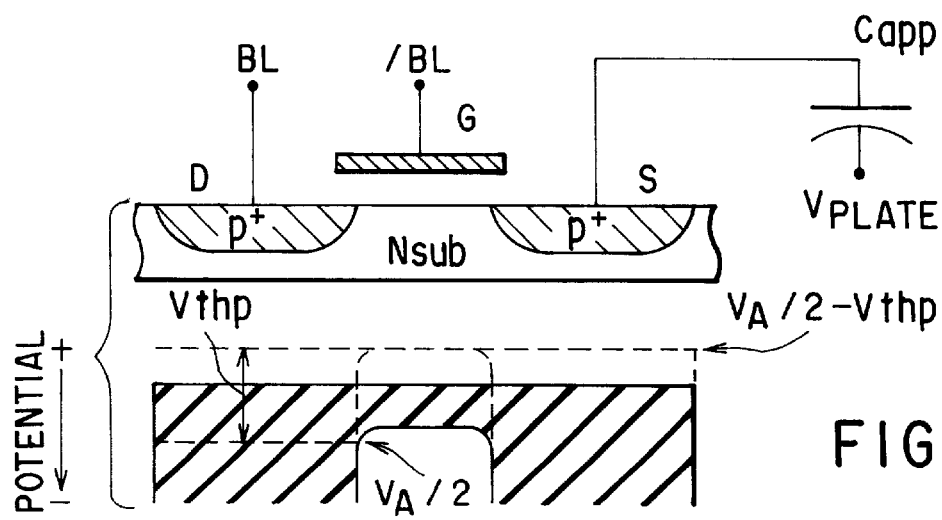
FIG. 10C shows the charge and potential distributions in the PMOS transistor at the termination of the sense operation in the fourth embodiment.

The PMOS transistor Q1 and the NMOS transistor Q4 form a positive feedback circuit. The source capacitor Capn charges the bit line /BL, whereas the source capacitor Capp charges the bit line BL. The positive feedback circuit automatically drives the gates of the transistors Q1 and Q4 until the bit line /BL and the source capacitor Capn, and the bit line BL and the source capacitor Capp perfectly share the same charge as shown in FIGS. 10A, 10B, and 10C.

The incremental change $\Delta V_{BL}$ in voltage on the bit line BL can be determined by $$\Delta V_{BL}=(C_c \times V_A/2+Capp \times |V_{thp}|)/(C_{BL}+C_c+Capp) \tag{1}$$

The incremental change $\Delta V_{/BL}$ in voltage on the bit line /BL can be determined by $$\Delta V_{/BL}=Capn \times |V_{thn}|/(C_{/BL}+Capn) \tag{2}$$

where $C_c$, $C_{BL}$ and $C_{/BL}$ are the capacitances of the cell capacitor, the bit line BL and the bit line /BL, respectively, $V_{thp}$ is the threshold voltage of the PMOS transistor Q1, and $V_{thn}$ is the threshold voltage of the NMOS transistor Q4.

A signal voltage $\Delta V_{signal}$ obtained between the paired bit lines BL and /BL is given by $$\Delta V_{signal}=\Delta V_{BL}+\Delta V_{/BL} \tag{3}$$

To obtain a large signal voltage $\Delta V_{signal}$, it is only required that $V_{thp}$, $V_{thn}$, Capp, Capn, $C_c$ and $V_A$ be increased. In a typical case with $C_c$=50 fF, $C_{BL}=C_{/BL}$=300 fF, $|V_{thn}|=|V_{thp}|$=1.0V, Capp=Capn=150 fF, and $V_A$=2.5V, $$\Delta V_{BL}=(50 \times 2.5/2+150 \times |-1.0|)/(300+50+150)=0.425V \tag{4}$$

$$\Delta V_{/BL}=150 \times |1.0|/(300+150)=0.333V \tag{5}$$

and hence $$\Delta V_{signal}=0.425V+0.333V=0.758V \tag{6}$$

On the other hand, $\Delta V_{signal}$ in the conventional sense amplifier is calculated to be $$\Delta V_{signal}=C_c \times V_A/2/(C_{BL}+C_c) \tag{7}$$

Using the same values, $$\Delta V_{signal}=50 \times 2.5/2/(300+50)=0.178V \tag{8}$$

The ratio of equation (6) to equation (8) is $$\Delta V_{signal}/\Delta V_{signal}=4.26 \tag{9}$$

The above example shows that the inventive sense amplifier can provide a signal voltage 4.26 times higher than the conventional sense amplifier.

Next, the restore operation of the semiconductor memory device according to a fifth embodiment will be described. The fifth embodiment will be described in terms of a restore operation of restoring cell data stored on a cell capacitor using the sense amplifier described in connection with the first to third embodiments.

Figure 11A:
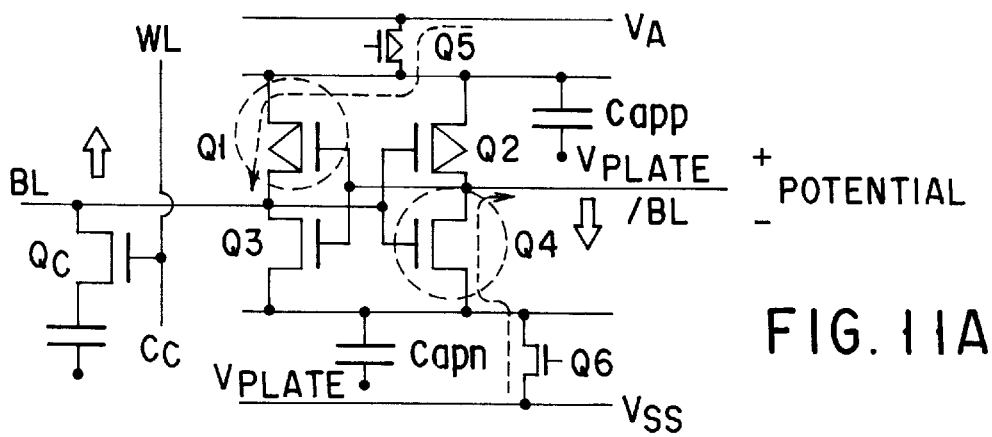
FIG. 11A shows an intermediate state of a sense operation in an equivalent circuit illustrating interconnection between a memory cell and a sense amplifier according to a fifth embodiment.

The restore operation is performed by, as shown in FIG. 11A, turning on switching transistors Q5 and Q6, coupling the supply voltage $V_A$ to the bit line BL through the conducting PMOS transistor Q1 enclosed with dashed line, coupling the supply voltage $V_{SS}$ to the bit line /BL through the conducting NMOS transistor Q4 enclosed with dashed line, and charging the bit lines BL and /BL to the supply voltages $V_A$ and $V_{SS}$, respectively.

In this case, the transistors Q1 and Q4 have been rendered conductive at the termination of the sense operation described previously as the fourth embodiment. Therefore, the transition from read operation to restore operation can be made more easily (smoothly) than in the prior art.

Figure 11B:
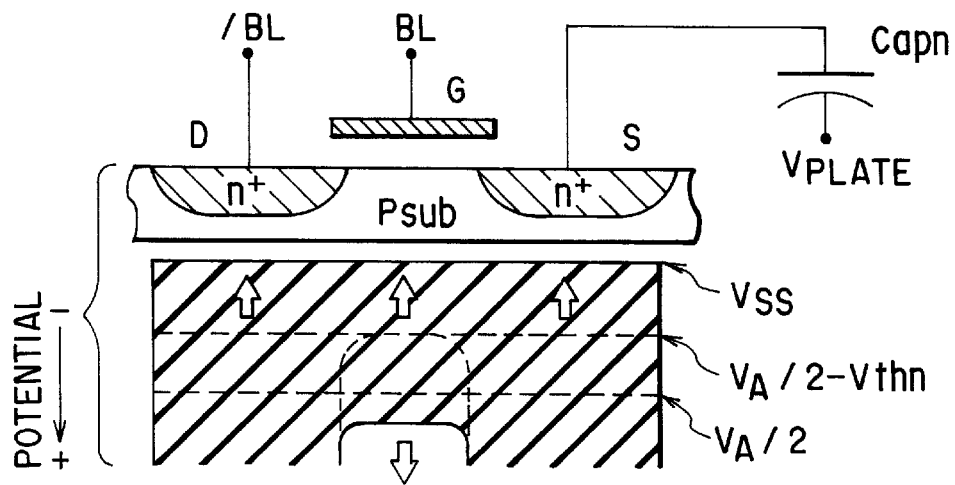
FIG. 11B illustrates variations in charge and potential distributions in the NMOS transistor in the intermediate state of the sense operation in the fifth embodiment.
Figure 11C:
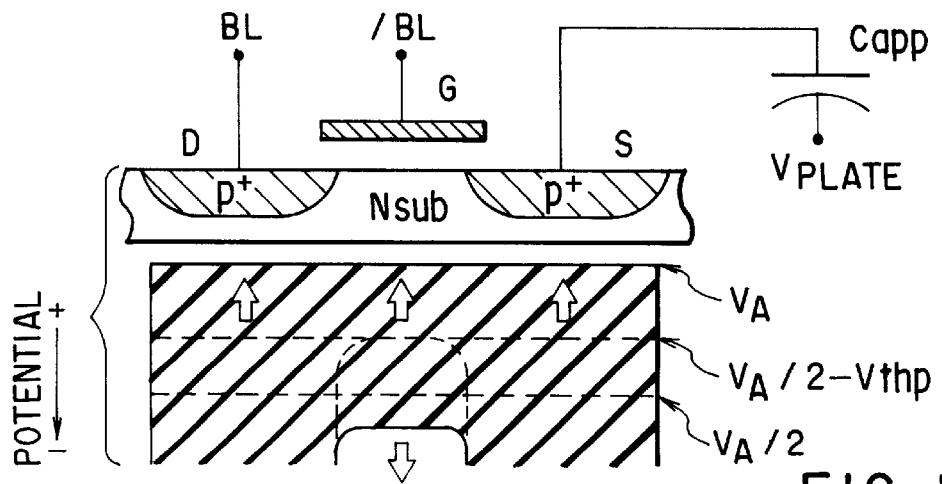
FIG. 11C illustrates variations in charge and potential distributions in the PMOS transistor in the intermediate state of the sense operation in the fifth embodiment.

FIGS. 11B and 11C show the potential distributions in the NMOS transistor Q4 and PMOS transistor Q1, respectively. Since the bit line /BL and the source capacitor Capn, and the bit line BL and the source capacitor Capp are driven until they share the same charges at the step of FIGS. 10B and 10C, the shared charges shift as indicated by bold arrows until the internal potentials in Q4 and Q1 reach $V_{SS}$ and $V_A$, respectively, in the restore operation.

Figure 12A:
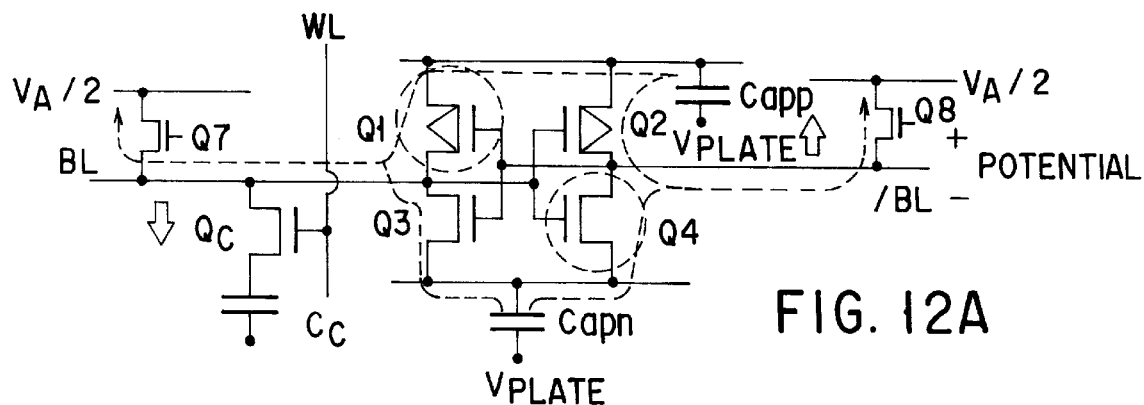
FIG. 12A shows an intermediate state of a precharge operation in an equivalent circuit illustrating interconnection between a memory cell and a sense amplifier according to a sixth embodiment.

Next, the precharge operation of the semiconductor memory device will be described as a sixth embodiment. Subsequent to the restore operation described as the fifth embodiment, in the sixth embodiment, the paired bit lines BL and /BL are coupled through switching transistors Q7 and Q8 to power supply line at $V_A/2$ as shown in FIG. 12A. As a result, the paired bit lines BL and /BL are equalized or precharged.

It should be noted that in practice the coupling of the bit lines to the power supply line at $V_A/2$ is achieved by means of the first equalization circuit composed of NMOS transistors Q16, Q17 and Q18 controlled by first equalize signal $\phi_{EQLn}$ and the second equalization circuit composed of NMOS transistors Q19, Q20 and Q21 controlled by second equalize signal $\phi_{EQLm}$ as shown in FIG. 1. In FIG. 12A, however, the first and second equalization circuits are replaced with the switching transistors Q7 and Q8 only for the purpose of simplifying illustration.

Figure 12B:
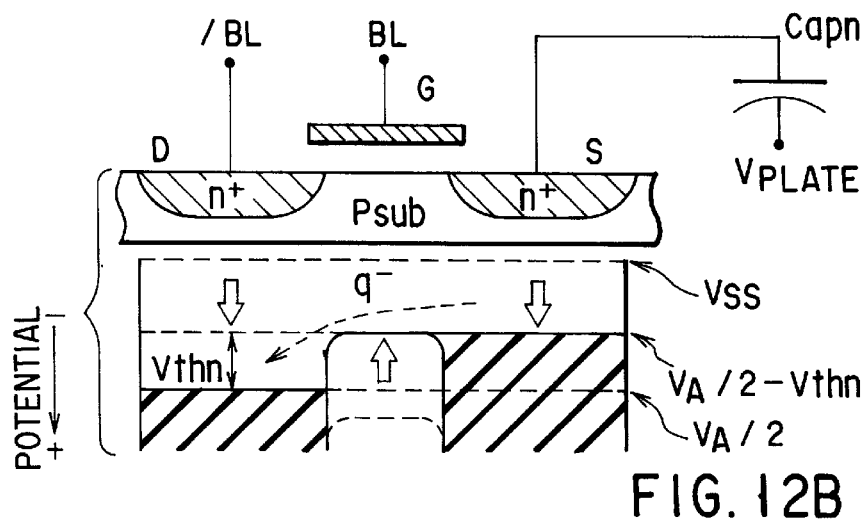
FIG. 12B illustrates variations in charge and potential distributions in the NMOS transistor in the intermediate state of the precharge operation in the sixth embodiment.
Figure 12C:
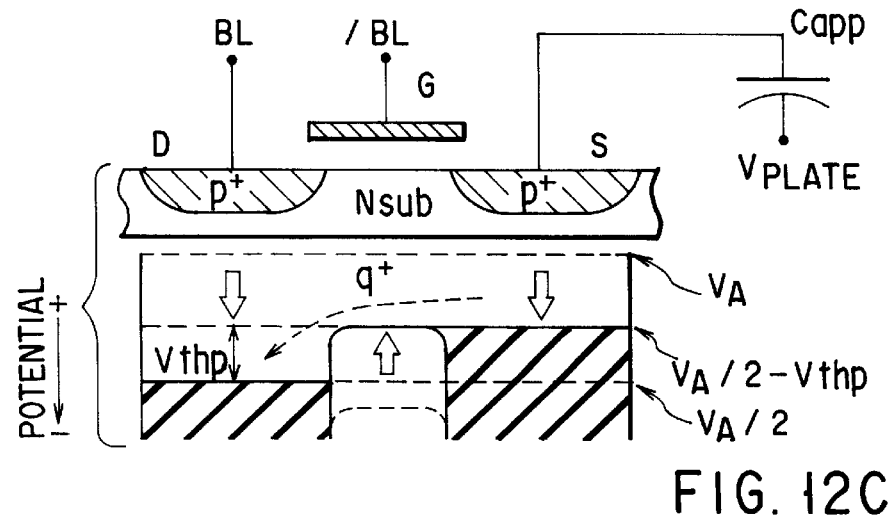
FIG. 12C illustrates variations in charge and potential distributions in the PMOS transistor in the intermediate state of the precharge operation in the sixth embodiment.

In the precharge operation, the switching transistors Q5 and Q6 in FIG. 11A are turned off at almost the same time the paired bit lines BL and /BL are equalized to $V_A/2$. Thus, charges stored on source capacitors Capn and Capp and bit line capacitance flow as indicated by dashed arrows in FIGS. 12A, 12B and 12C and, at the same time, the transistors Q1, Q2, Q3 and Q4 have their respective drain, source and gate potentials reset to the initial states shown in FIGS. 4B and 5B.

The basic operation of the inventive sense amplifier having the source capacitors Capn and Capp as auxiliary capacitances have been described so far. Further, the difference in operation between the inventive and conventional sense amplifiers will be discussed below using transition diagrams shown in FIGS. 13A and 13B.

Figure 13A:
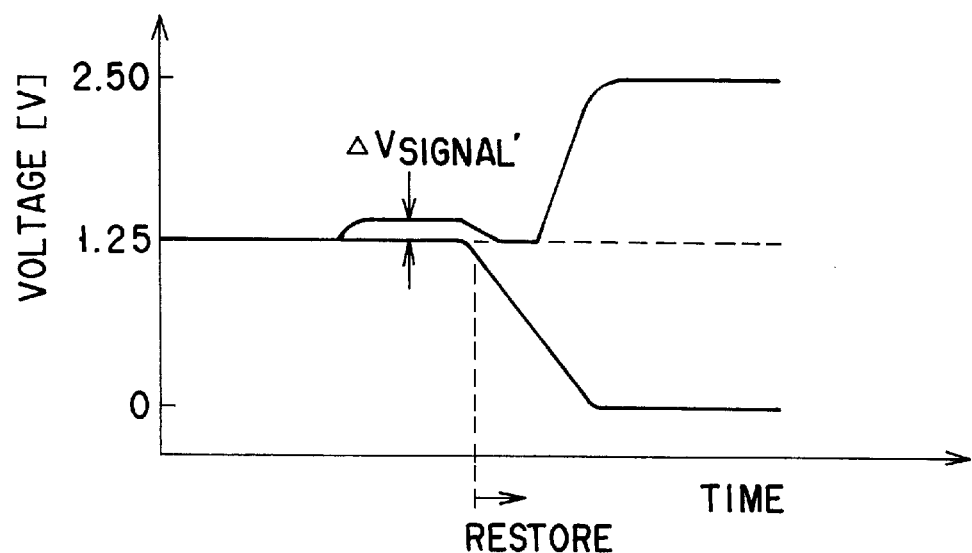
FIG. 13A shows the operating transition characteristics of the conventional sense amplifier.

FIG. 13A shows the operating transition diagram for the conventional sense amplifier. In the conventional sense amplifier, as indicated in equation (7), charges stored on the cell capacitor $C_c$ are simply distributed between the capacitance $C_{BL}$ associated with the bit line BL and the cell capacitor $C_c$ and a change in the voltage on the bit line BL is output as a signal voltage $\Delta V_{signal}$ from the sense amplifier.

That is, the conventional sense amplifier exhibits circuit characteristics such that, as shown in FIG. 13A, only a change in the voltage on one of the paired bit lines BL and /BL subjected to equalization, i.e., the bit line BL, is taken as signal voltage $\Delta V_{signal}$ and the signal voltage then becomes zero temporarily at the time of transition to the restore operation.

Figure 13B:
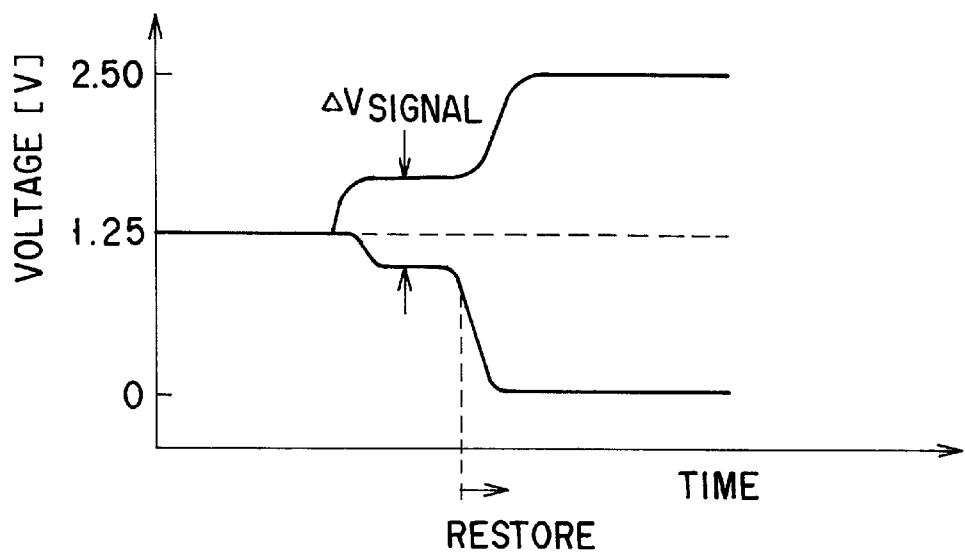
FIG. 13B shows the operating transition characteristics of the inventive sense amplifier.

However, the inventive sense amplifier having source capacitors Capn and Capp operates in such a way that charges stored on these source capacitors act to make the potential difference between the paired bit lines BL and /BL large through the positive feedback action of the transistors Q1 and Q4 as indicated in equations (1), (2) and (3) and hence can provide a larger output voltage $\Delta V_{signal}$ than the conventional amplifier as shown in FIG. 13B.

In addition, as described previously in connection with the fifth embodiment, the transition from sense operation to restore operation can be made smoothly, allowing the time required to make the transition to be reduced.

Next, the sense operation of the semiconductor memory device will be described as a seventh embodiment of the present invention. In the seventh embodiment, a description is given of means for performing a sense operation different from that in the fourth embodiment using the inventive sense amplifier.

Figure 14A:
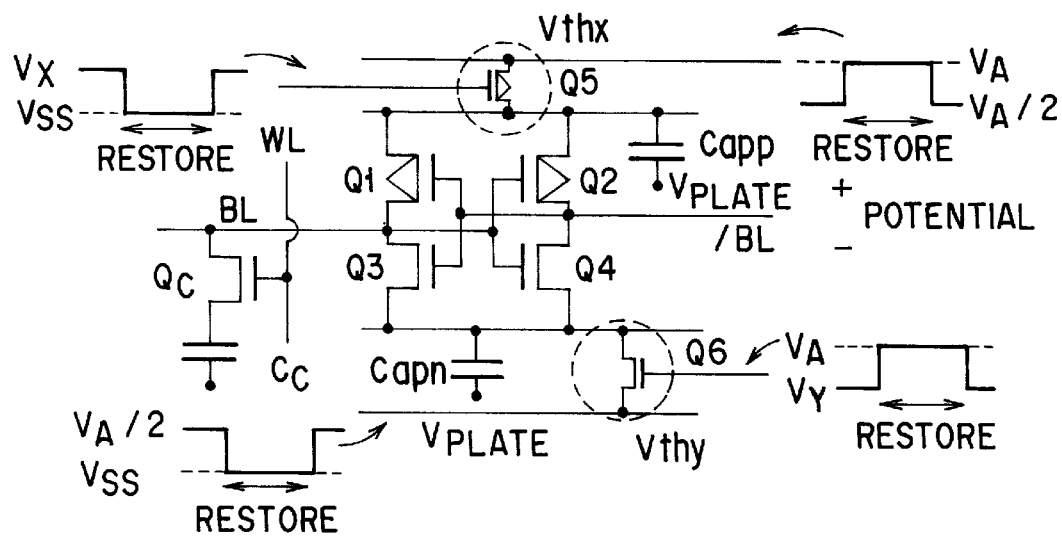
FIG. 14A shows a restore operation in an equivalent circuit illustrating interconnection between a memory cell and a sense amplifier according to a seventh embodiment.

As shown in FIG. 14A, the switching transistors Q5 and Q6 enclosed with dashed line have their respective threshold voltages set at $V_{thx}$ and $V_{thy}$, respectively, and their respective gate voltages at standby time set at $V_x$ and $V_y$, respectively. Here, the gate voltage $V_x$ of Q5 is set a little lower than $V_A/2$ and the gate voltage $V_y$ of Q6 is set a little higher than $V_A/2$.

Figure 14B:
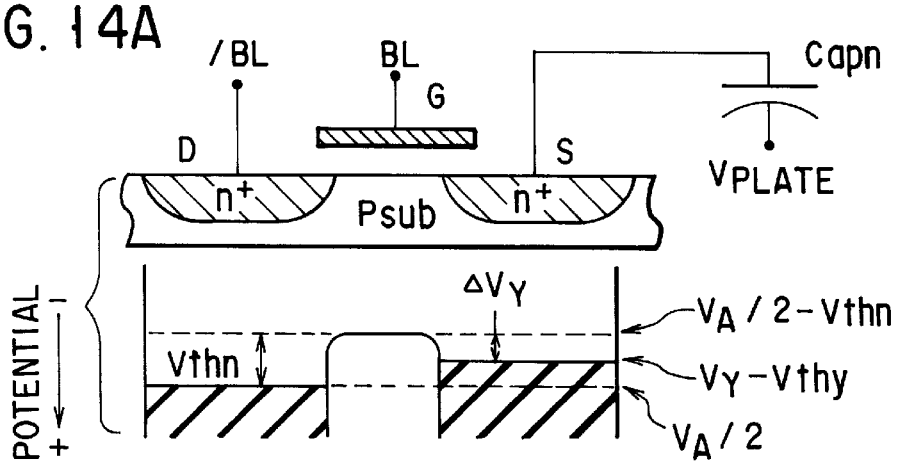
FIG. 14B illustrates variations in charge and potential distributions in the NMOS transistor in the restore operation in the fifth embodiment.
Figure 14C:
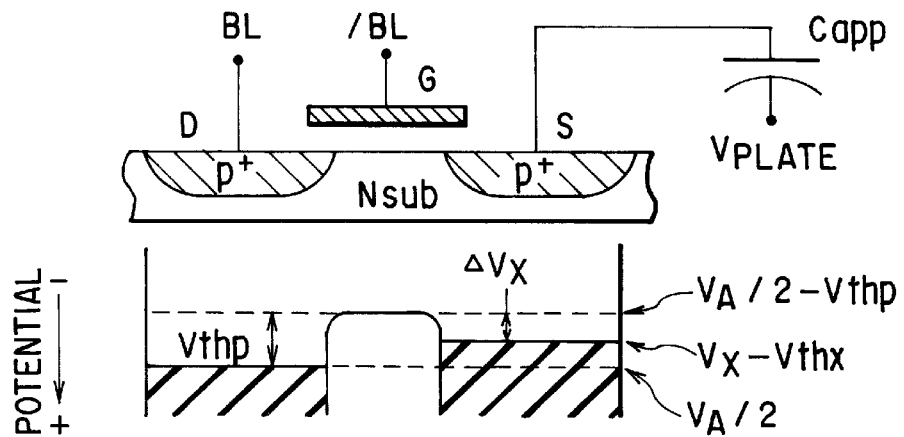
FIG. 14C illustrates variations in charge and potential distributions in the PMOS transistor in the restore operation in the fifth embodiment.

Then, the transistors Q1 (or Q2) and Q4 (or Q3) will have $\Delta V_x$ and $\Delta V_y$, respectively, as the difference between the source and the channel potential as shown in FIGS. 14C and 14B. Thus, malfunctions due to noise can be circumvented by imparting margins of $\Delta V_x$ and $\Delta V_y$.

In order to operate the inventive sense amplifier normally under such settings, it is required to drive the source and gate of each of the switching transistors Q5 and Q6 with such voltage waveforms as shown in FIG. 14A at restore time. The waveforms at the upper right and lower left of FIG. 14A indicate voltage waveforms on the power supply lines connected to the transistors Q5 and Q6, respectively. The waveforms at the upper left and lower right of FIG. 14A indicate voltage waveforms on the gates of the transistors Q5 and Q6, respectively.

Although the sense margin is reduced in comparison with the operation shown in FIGS. 8 through 13, the possibility of malfunctions due to noise can be reduced. Although the preferred embodiments of the present invention have been described, it is apparent that other embodiments and modifications are possible.

According to the semiconductor memory device of the present invention, as described above, trench or stacked capacitors are connected with the common sources of NMOS transistors and PMOS transistors contained in a CMOS flip-flop of a sense amplifier connected to paired bit lines as auxiliary capacitance for cell capacitors. When a memory cell is selected through a word line, the CMOS flip-flop can operate automatically to perform a sense operation of discharging charges on the source capacitors connected to the common sources of the transistors to the paired bit lines.

In the sense operation, the positive feedback circuit formed by an NMOS and a PMOS transistor automatically in the sense amplifier permits the transition from a high-sensitivity sense operation by which a small signal voltage between the paired bit lines is amplified to a restore operation to be made smoothly using the NMOS and PMOS transistors which have been rendered conductive.

Thus, a semiconductor memory device can be provided which has high-speed, high-sensitivity sense amplifiers and is therefore suitable for high-packing-density DRAMs in which it is difficult to sense small signal levels.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell array;
   a sense amplifier connected to a pair of complementary bit lines, the sense amplifier having a CMOS flip-flop circuit composed of a pair of PMOS transistors having their sources connected together and a pair of NMOS transistors having their sources connected together;
   a first source capacitor connected to the common sources of the pair of PMOS transistors; and
   a second source capacitor connected to the common sources of the pair of NMOS transistors.

2. The semiconductor memory device according to claim 1, wherein each of the first and second source capacitors consists of a trench capacitor or stacked capacitor formed between the corresponding transistors.

3. The semiconductor memory device according to claim 1, wherein the sense amplifier is connected between first and second supply voltages, the first source capacitor stores an amount of charge corresponding to the sum of the average value of the first and second supply voltages and the absolute value of the threshold voltage of the PMOS transistors, the second source capacitor stores an amount of charge corresponding to the sum of the average value of the first and second supply voltages and the absolute value of the threshold voltage of the NMOS transistors, and in a state where the sense amplifier is coupled with a cell capacitor in the memory cell array a sense operation is performed which divides charges stored on the first and second source capacitors between the capacitance associated with the bit lines and the capacitance of the cell capacitor.

4. The semiconductor memory device according to claim 1, wherein the sense amplifier is connected between first and second supply voltages, the CMOS flip-flop circuit comprises a first CMOS inverter consisting of one of the PMOS transistors and one of the NMOS transistors and a second CMOS inverter consisting of the other of the PMOS transistors and the other of the NMOS transistors, and a restore operation for a cell capacitor is performed by connecting the first supply voltage to one of the bit lines through a switching transistor connected to the first supply voltage and the PMOS transistor in the first CMOS inverter and connecting the second supply voltage to the other of the bit lines through a switching transistor connected to the second supply voltage and the NMOS transistor in the second CMOS inverter.

5. The semiconductor memory device according to claim 1, wherein the sense amplifier is connected between first and second supply voltages, the CMOS flip-flop circuit comprises a first CMOS inverter consisting of one of the PMOS transistors and one of the NMOS transistors and a second CMOS inverter consisting of the other of the PMOS transistors and the other of the NMOS transistors, and a precharge operation for the bit lines is performed by discharging charges stored on the first and second source capacitors through the NMOS and PMOS transistors in the first CMOS inverter, one of the bit lines which is connected to the common drains of the NMOS and PMOS transistors in the first CMOS inverter and a switching transistor connected to the one of the bit lines to a terminal placed at the average voltage of the first and second supply voltages and discharging the charges stored on the first and second source capacitors through the NMOS and PMOS transistors in the second CMOS inverter, the other of the bit lines which is connected to the common drains of the NMOS and PMOS transistors in the second CMOS inverter and a switching transistor connected to the other of the bit lines to a terminal placed at the average voltage of the first and second supply voltages.

6. A semiconductor memory device comprising:
   a memory cell array having memory cells arranged in rows and columns, each of the memory cells being composed of one cell transistor and one cell capacitor;
   word lines each extending in the row direction of the memory cell array and pairs of complementary bit lines each extending in the column direction of the memory cell array; and
   sense amplifiers each connected with a corresponding one of the pairs of complementary bit lines,
   in each of the memory cells the cell capacitor having its plate connected to the source of the cell transistor and the cell transistor having its gate connected with a corresponding one of the word lines and its drain connected to one bit line of a corresponding one of the pairs of complementary bit lines,
   each of the sense amplifiers comprising a CMOS flip-flop circuit composed of first and second PMOS transistors and first and second NMOS transistors,
   in the CMOS flip-flop circuit the first and second PMOS transistors having their sources connected to a first supply voltage through a first switching transistor and the first and second NMOS transistors having their sources connected to a second supply voltage through a second switching transistor,
   the first PMOS transistor and the first NMOS transistor having their drains connected together to the one bit line and their gates connected together to the other bit line of the corresponding one of the pairs of complementary bit lines,
   the second PMOS transistor and the second NMOS transistor having their drains connected together to the other bit line and their gates connected together to the one bit line,
   the first and second PMOS transistors having their sources connected together to a first source capacitor, and
   the first and second NMOS transistors having their sources connected together to a second source capacitor.

7. The semiconductor memory device according to claim 6, wherein in a sense operation of the sense amplifier a positive feedback circuit is formed such that the cell transistor is rendered conductive by the word line being selected, charge stored on the cell capacitor is discharged to the one bit line through the cell transistor,
   the potential on the channel of the second NMOS transistor goes high through its gate connected to the one bit line by the voltage on the one bit line that has changed as a result of the discharging of the cell capacitor going higher than the precharged voltage of the bit lines, charge stored on the second source capacitor connected to the source of the second NMOS transistor is discharged through its channel to the other bit line, and the first PMOS transistor is rendered conductive by the potential on the other bit line going lower as a result of the discharging of the second source capacitor, thereby allowing charge stored on the first source capacitor to be discharged to the one bit line and further increasing the voltage on the one bit line.

8. The semiconductor memory device according to claim 7, wherein the sense operation of the sense amplifier is performed by applying a voltage lower than the average of the first and second supply voltages to the gate of the first switching transistor and applying a voltage higher than the average of the first and second supply voltages to the gate of the second switching transistor.

9. The semiconductor memory device according to claim 7, wherein a restore operation for charge stored on the cell capacitor is performed by applying the first supply voltage to the one bit line through the first switching transistor and the first PMOS transistor which has been rendered conductive in the sense operation and applying the second supply voltage to the other bit line through the second switching transistor and the second NMOS transistor which has been rendered conductive in the sense operation.

10. The semiconductor memory device according to claim 8, wherein a restore operation for charge stored on the cell capacitor is performed by applying the first supply voltage to the one bit line through the first switching transistor and the first PMOS transistor which has been rendered conductive in the sense operation and applying the second supply voltage to the other bit line through the second switching transistor and the second NMOS transistor which has been rendered conductive in the sense operation.

* * * * *